United States Patent

Kawauchi

[11] Patent Number: 5,856,797
[45] Date of Patent: Jan. 5, 1999

[54] DATA ENCODING DEVICE, DATA DECODING DEVICE, DATA ENCODING METHOD AND DATA DECODING METHOD

[75] Inventor: Tetsuya Kawauchi, Tokyo, Japan

[73] Assignee: Sega Enterprises Ltd., Tokyo, Japan

[21] Appl. No.: 700,407

[22] PCT Filed: Jan. 26, 1996

[86] PCT No.: PCT/JP96/00153

§ 371 Date: Nov. 20, 1996

§ 102(e) Date: Nov. 20, 1996

[87] PCT Pub. No.: WO96/23359

PCT Pub. Date: Aug. 1, 1996

[30] Foreign Application Priority Data

Jan. 26, 1995 [JP] Japan ..................................... 7-10310

[51] Int. Cl.⁶ ............................................. H03M 7/30
[52] U.S. Cl. ............................................. 341/76; 341/87
[58] Field of Search .................................. 341/50, 76, 77, 341/87

[56] References Cited

U.S. PATENT DOCUMENTS

| | | | |
|---|---|---|---|
| 4,414,536 | 11/1983 | Sumi | 341/76 |
| 4,719,451 | 1/1988 | Heck | 341/76 |
| 4,813,056 | 3/1989 | Fedele | 375/27 |
| 5,043,728 | 8/1991 | Hoshi et al. | 341/106 |
| 5,600,316 | 2/1997 | Moll | 341/87 |
| 5,608,398 | 3/1997 | Hashimoto et al. | 341/76 |

FOREIGN PATENT DOCUMENTS

| | | |
|---|---|---|
| 58-171094 | 10/1983 | Japan . |
| 59-35040 | 2/1984 | Japan . |
| 59-171094 | 9/1984 | Japan . |
| 62-82723 | 4/1987 | Japan . |
| 62-98919 | 5/1987 | Japan . |
| 1-208029 | 8/1989 | Japan . |
| 1-252022 | 10/1989 | Japan . |
| 2-46025 | 2/1990 | Japan . |
| 4-35124 | 2/1992 | Japan . |
| 4-239272 | 8/1992 | Japan . |
| 4-273723 | 9/1992 | Japan . |

Primary Examiner—Marc S. Hoff
Attorney, Agent, or Firm—Finnegan, Henderson, Farabow, Garrett & Dunner, L.L.P.

[57] ABSTRACT

A data encoding and decoding device and method uses simple algorithms and keeps encoding error to a minimum. The data encoding device includes an original data splitting section for splitting data into "higher order data" and "lower order data," which represents the most significant portion of a digital data sample and the least significant portion of the digital data sample, respectively. Further, a differential calculation section calculates a difference between successive samples of the higher order data, and a number-of-items calculation section determines the number of data samples in the input data series. The lower order data and the differential data are then combined to obtain the encoded data.

13 Claims, 11 Drawing Sheets

|1|1| |1|8| |2|0| |5|A| |8|C| • • •

FIG. 10

| 1 | 0 BITS OMITTED FORMAT |
|---|---|
| 2 | 1 BIT OMITTED FORMAT (USING THE OMITTED BITS FOR ADDITION) |
| 3 | 1 BIT OMITTED FORMAT (USING THE OMITTED BITS FOR ADDITION) |
| 4 | 2 BITS OMITTED FORMAT |
| 5 | FORMAT IN WHICH THE DIFFERENCE BETWEEN THE PREVIOUS DATA IS COMPRESSED BY 3 BITS (DIFFERENTIAL PCM) NOTE THAT THESE 2 BITS OF DATA ARE USED FOR ADDITION |
| 6 | FORMAT IN WHICH THE DIFFERENCE BETWEEN THE PREVIOUS DATA IS COMPRESSED BY 2 BITS (DIFFERENTIAL PCM) NOTE THAT THESE 2 BITS OF DATA ARE USED FOR SUBTRACTION |
| 7 | 1 BYTE MODE. FORMAT IN WHICH THE ORIGINAL DATA IS HELD DIRECTLY |
| 8 | AMPLITUDE 0 MODE. FORMAT EXPRESSING 0 AMPLITUDE (SOUNDLESS) |

FIG. 11

DATA ENCODING DEVICE, DATA DECODING DEVICE, DATA ENCODING METHOD AND DATA DECODING METHOD

TECHNICAL FIELD

The present invention relates to a data encoding device, data decoding device, data encoding method, and data decoding method, and more particularly to a data encoding device, data decoding device, data encoding method, and data decoding method whereby audio data, video data and the like are compressed and decompressed.

BACKGROUND ART

In the field of what is termed multimedia, including games machines, data encoding is often used to compress audio data, video data and the like in order to record the audio data and the like efficiently on a memory cassette, CD-ROM or the like. Encoding methods such as APCM, DPCM, and ADPCM have long been known as such data encoding methods. These encoding methods basically involve the calculation of data differentials and allow compression and decompression using comparatively simple algorithms.

Further, recent years have seen the adoption of data encoding methods such as the JPEG (Joint Photographic Coding Expert Group) and the MPEG (Moving Picture Expert Group) methods. Data encoding using JPEG, MPEG, and other such methods involve DCT (discrete cosine transformation) processing, quantization processing and the like, which are orthogonal function transformations, and allow comparatively efficient compression and decompression.

Other data encoding methods include those disclosed in Laid-open Japanese Patent Application S. 58-171094 and Laid-open Japanese Patent Application S. 59-35040. The data encoding method disclosed in Laid-open Japanese Patent Application S. 58-171094 is one in which, after the higher order development formula has been developed, data is compressed with reference to the development formula correlation on the time axis. Further, the data encoding method disclosed in Laid-open Japanese Patent Application S. 59-171094 is one in which data compression is carried out by expressing waveform data using two types of data, namely envelope information and the waveform pitch.

However, the following problems have arisen in the various data encoding methods mentioned above, and elsewhere.

The DPCM, DPCM and ADPCM data encoding methods have a problem in that, although they allow the original data to be compressed using a comparatively simple algorithm, compression and decompression are accompanied by substantial sound quality deterioration. For example, in cases such as when there is a substantial amount of variation in the original data, there are instances where differentials of the original data exceed the predetermined data length. As a result, errors occur between the data after decoding and the original data, and these errors become quantization noise and are a cause of sound quality deterioration and picture quality deterioration.

Further, JPEG, MPEG, and other such data encoding methods have the advantage that they can achieve relatively high compression ratios. However, JPEG, MPEG, and other such data encoding methods require complicated algorithms such as DCT and the processing is therefore complicated and a long time is required for processing.

Moreover, the data encoding method disclosed in Laid-open Japanese Patent Application S. 58-171094 requires the calculation of a higher order development formula for the original data, and the encoding and decoding algorithms become complicated. In the data encoding method disclosed in Laid-open Japanese Patent Application S. 59-35040, there is liable to be a substantial error between the data after decoding and the original data because the original data is expressed using only the envelope and the pitch.

The present invention has taken the above situation into account, and the object of the invention is to carry out compression and extension with little encoding or decoding error using simple algorithms in a data encoding device, data decoding device, data encoding method, and data decoding method.

SUMMARY OF THE INVENTION

The present invention is directed to methods and systems for encoding and decoding data.

The present invention makes it possible to correctly decode an encoded data string which has been encoded matched with the original data. Further, it allows high-speed decoding since the respective decoding processes are carried out using simple algorithm.

According to a first aspect, the present invention is directed to a data encoding device comprising a combination of elements, including, an input means which inputs original data strings in which original data comprising a plurality of bits has been arranged into a plurality of sequences; original data splitting means for splitting original data into higher order data including the highest order bit and lower order data including the lowest order bit; differential calculation means for calculating differential data between respective items of the higher order data in neighbouring items of original data; and output means for outputting an encoded data string including said lower order data and said differential data.

According to a second aspect, the present invention is directed to a data decoding device comprising a combination of elements. The combination includes: an input means for inputting an encoded data string; an encoded data splitting means for extracting differential data and lower order data by splitting the encoded data string; a differential decoding means for generating higher order data based on the differential data; a decoded data combining means for generating decoded data corresponding to a non-encoded version of the data string by combining the higher order data and lower order data; and an output means for outputting the decoded data string in which a plurality of items of decoded data have been sequenced.

Additional aspects of the present invention include methods related to the encoding and decoding devices.

BEST MODE FOR CARRYING OUT THE INVENTION

An embodiment of the present invention is discussed below with reference to the figures.

(Configuration of a first embodiment)

Figure 1:
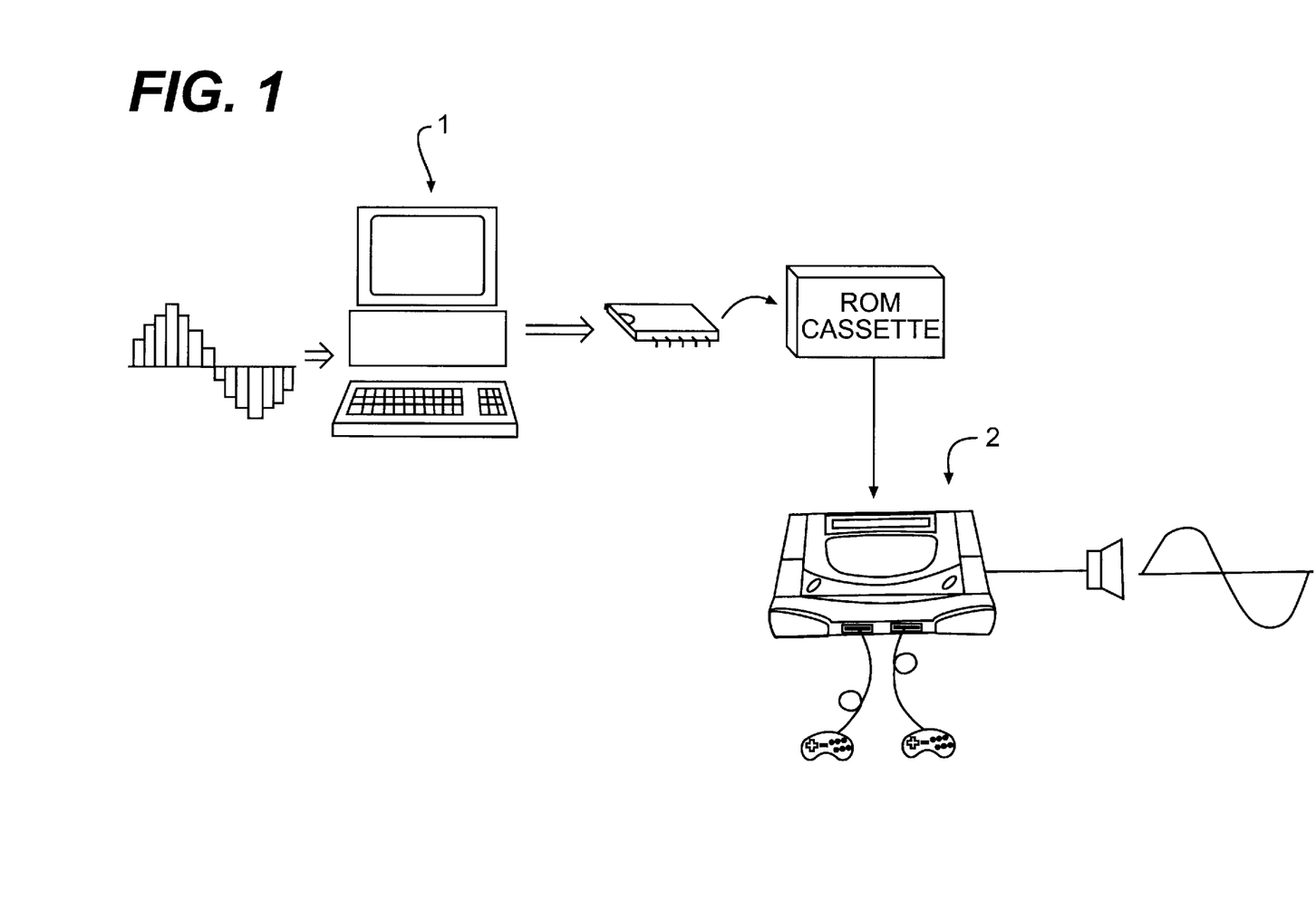
FIG. 1 is a concept diagram of a data encoding device and data decoding device according to a first embodiment of the present invention.

FIG. 1 is a concept diagram of a data encoding device and a data decoding device according to a first embodiment of the present invention. The data encoding device 1 is made up of a workstation or the like, and has the function of encoding an original data string (audio data, video data or the like) expressed as digital data. In the data encoding device 1, the encoded data string which has been encoded is written into a ROM together with an application program, and the ROM is housed inside a ROM cassette. The data decoding device 2, such as a TV games machine, comprises a cartridge where the ROM cassette is fitted, and it decodes the encoded data string read out from the ROM cassette and generates a decoded data string. The configuration is such that the decoded data string, which is digital data, is converted into an analog audio signal by the data decoding device 2 and is then output from a speaker.

Figure 2:
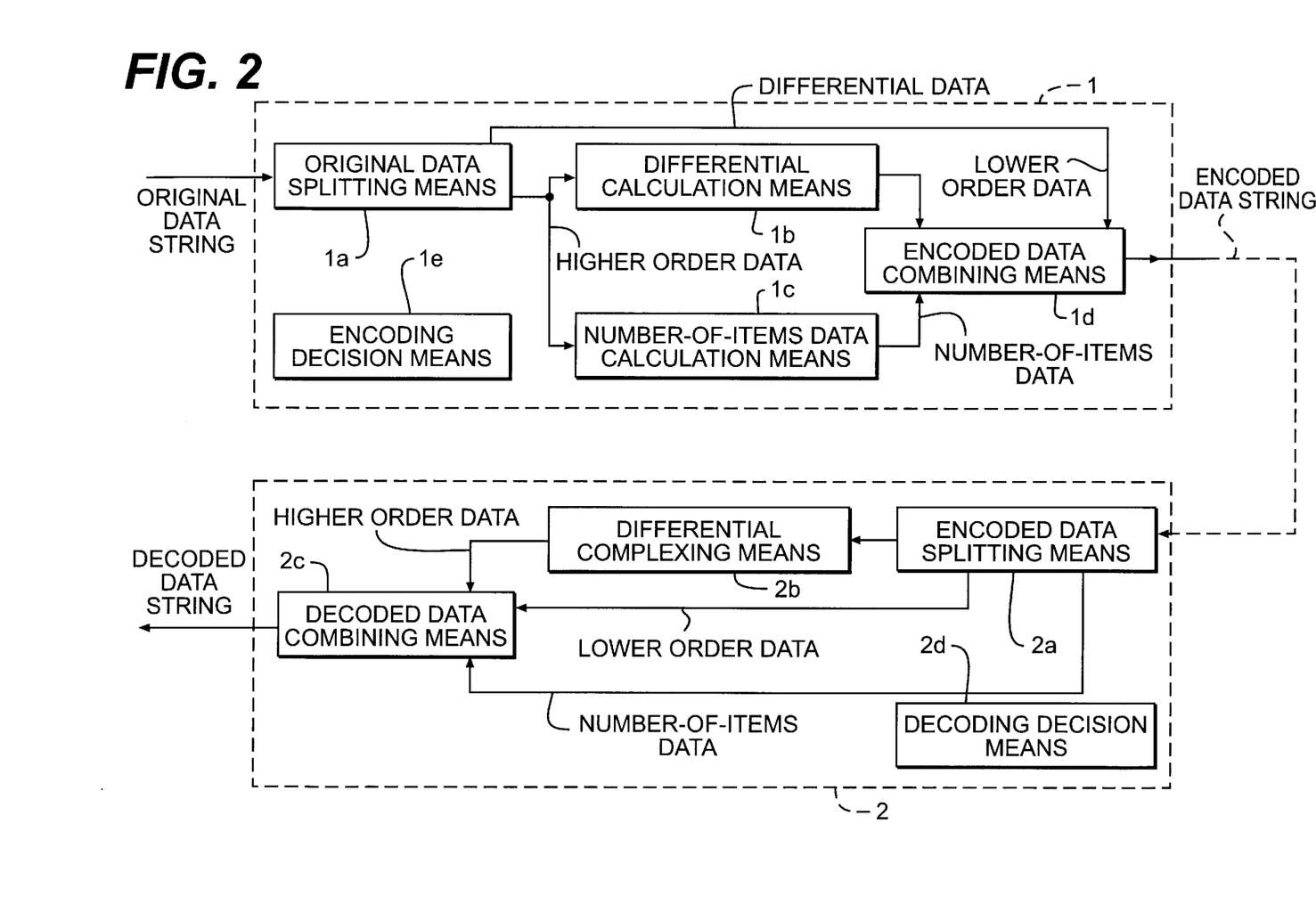
FIG. 2 is a functional block diagram of a data encoding device and data decoding device according to the first embodiment of the present invention.

FIG. 2 is a functional block diagram for the data encoding device 1 and the data decoding device 2. The data encoding device 1 comprises an original data splitting means 1a, differential calculation means 1b, data number calculation means 1c, encoded data combining means 1d, and encoding decision means 1e. The configuration is such that an original data string (bit stream) comprising a plurality of items of original data is input into the original data splitting means 1a. The original data string is digital data in which an analog audio signal has been subjected to 8-bit linear quantization. It should be noted that visual data, application programs and the like may be used as the original data string instead of audio data.

The original data splitting means 1a splits the 8-bit original data into higher order data of the higher order 4 bits and lower order data of the lower order 4 bits. The differential calculation means 1b has the function of calculating differential data between items of higher order data in neighbouring items of original data. The differential data comprises a count flag which represents the differential of the items of higher order data, and a sign flag which represents the sign of the differential. For example, assuming that the higher order data of the first byte is "Fh" and the higher order data of the second byte is "Eh", the difference of "Eh" relative to "Fh" is expressed as "−1" in decimal notation. When this "−1" is expressed in binary, the count flag is "1" and the sign flag is "1". Further, when the differential data is "1" in decimal notation, the count flag is "1" and the sign flag is "0". Moreover, there will also be cases where the sign flag or the count flag is not used depending on the encoding modes discussed hereinbelow.

Figure 3:
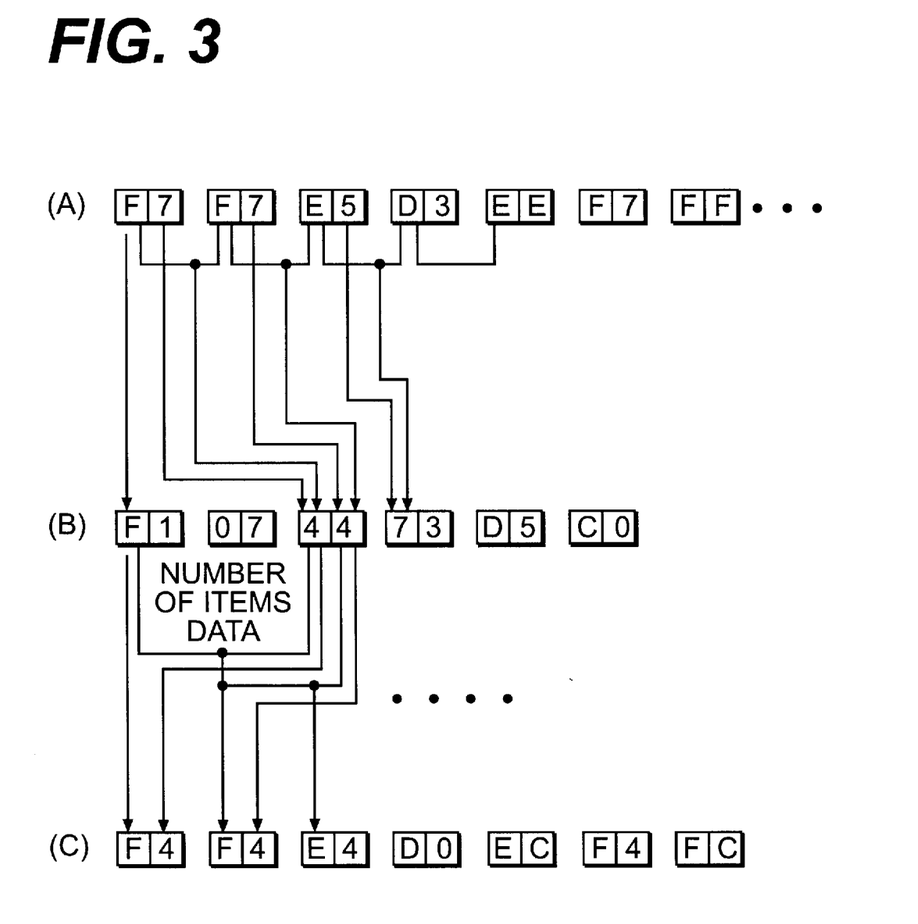
FIG. 3 is a diagram showing an example of an original data string, an encoded data string, and a decoded data string according to the first embodiment of the present invention.

The data number calculation means 1c has the function of calculating number-of-items data representing the number of items of higher order data, in continuous higher order data, within a predetermined range (±1, +1, −1, or 0). For example, when the original data string is as shown in FIG. 3 (A) and seven neighbouring items of higher order data are confined within the range of ±1, the number-of-items data is "7h". It should be noted that the encoding modes which are discussed hereinbelow determine whether to calculate the number of higher order bits in the range ±1, +1, −1, or 0.

Figure 4:
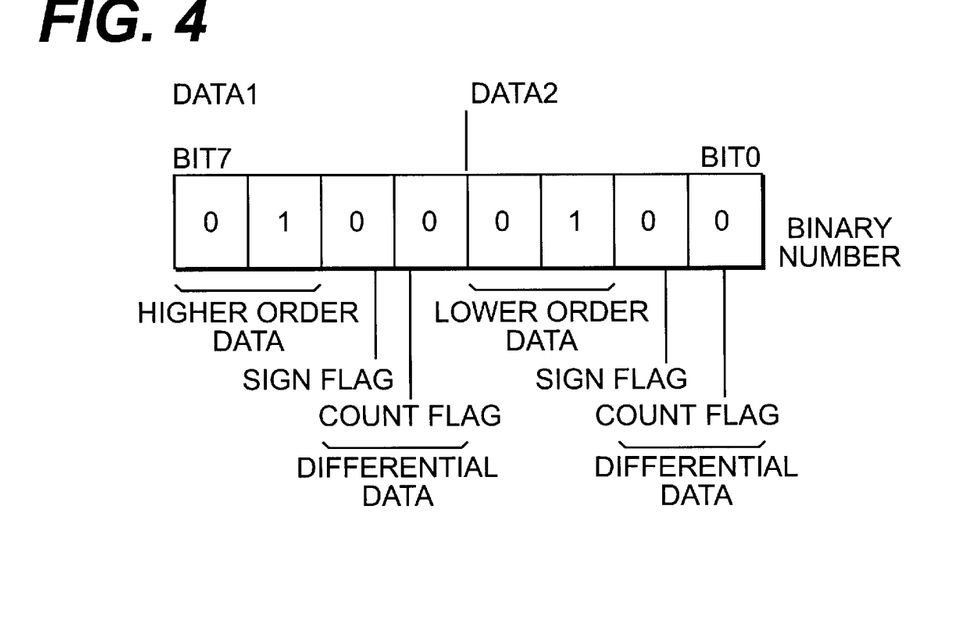
FIG. 4 is a diagram explaining the format of encoded data according to the first embodiment of the present invention.

The encoded data combining means 1d has the function of combining lower order data and differential data, as well as outputting the number-of-items data and the like in a predetermined format as shown in FIG. 3 (B) and FIG. 4.

The encoding decision means 1e controls the original data splitting means 1a, differential calculation means 1b, data number calculation means 1c, and encoded data combining means 1d in accordance with a predetermined encoding mode. There are 3 encoding modes, a first to a third mode, which are freely interchangeable by the user by operating a keyboard.

The data decoding device 2 comprises an encoded data splitting means 2a, differential decoding means 2b, decoded data combining means 2c, and decoding decision means 2d. The encoded data splitting means 2a separates the differential data, number-of-items data and lower order data from the input encoded data string. The differential decoding means 2b has the function of decoding higher order data based on differential data (sign flag and count flag), and the decoded data combining means 2c has the function of combining decoded higher order data and lower order data.

For example, the encoded data splitting means 2a extracts lower order data "4h" after decoding from the higher order 2 bits of the higher order data in the third byte shown in FIG. 3 (B), and similarly extracts the differential data "00" from the lower order 2 bits of the higher order data in the third byte. Further, based on the higher order data "Fh" of the first byte in the figure (B) and the differential data "00" extracted from the higher order data of the third byte, the differential decoding means 2b calculates the higher order data "Fh" of the second byte of the decoded data ((C) in the figure). The higher order data and lower order data of the decoded data then continue to be decoded in the same way. The configuration is such that, after decoding, the data is output from the data decoded data combining means 2c as decoded data.

Further, the decoding decision means 2d controls the encoded data splitting means 2a, differential decoding means 2b, and decoded data combining means 2c, the desired decoding method, in accordance with the encoding mode decided by the encoding decision means 1e. In other words, the encoded data splitting means 2a, differential decoding means 2b, and decoded data combining means 2c carry out a decoding process which is matched with the encoding mode.

Here, an encoding format according to the present embodiment is described with reference to FIG. 3 and FIG.

4. FIG. 3 (A) represents an original data string, and (B) in the figure represents the encoded data string. Further, (C) in the figure represents the decoded data string. Also, FIG. 4 represents encoded data from the third byte onwards in the encoded data string. In the encoded data string shown in FIG. 3 (B), the higher order 4 bits of data "Fh" of the first byte represent the higher order data of the first byte of the original data string ((A) in the figure). The lower order 4 bits of data "1h" of the first byte the encoded data ((B) in the figure) denote the initial byte of an encoded data string. In other words, the decoding device 2 is able to carry out a process of decoding the encoded data string by detecting the lower order data "1h".

The data of the second byte in the encoded data string ((B) in the figure) represents number-of-items data. For example, the number-of-items data "07h" represents encoding of 7 items of original data. Further, because the number-of-items data is expressed by 8 bits, in the present embodiment a total of 256 items of original data can be encoded at one time. In this regard, when the original data string has more than 256 items of original data, more than 256 items of original data can be encoded by encoding over a plurality of times. Items of data from the third byte of the encoded data string onwards consist of lower order data of the original data, and differential data.

FIG. 4 shows details of the encoded data from the third byte onwards. In the encoded data from the third byte onwards, the data of the higher order 2 bits of the higher order data and lower order data respectively, represents data of the higher order 2 bit of the lower order data of the original data. For example, when the lower order data of the first byte of original data is "7h" ("0111 in binary notation), the higher order 2 bits of the lower order data will be "01" once the lower order 2 bits of the "0111" are omitted.

In the encoded data from the third byte onwards, the lower order 2 bits of the upper order data and the lower order data respectively represent differential data between items of higher order data in neighbouring items of original data. For example, differential data for the higher order data "Fh" of the original data in the first byte and the higher order data "Fh" of the original data in the second byte is "00" (binary notation). In other words, both the count flag and the sign flag in the differential data are "0". By combining this differential data "00" to the higher order 2 bits "01" of the lower order data discussed above, the data obtained is "0100" (binary notation). Moreover, in hexadecimal notation, this data is "04h" (the higher order data of the third byte in FIG. 3 (B)). Similarly, by combining the differential data for the higher order data of the second byte and the third byte of the original data to the higher order 2 bits of the lower order data "7h" (FIG. 3 (A)) of the second byte of the original data, the lower order data "4h" of the third byte of sign data is determined.

It should be noted that the encoded data string shown in FIG. 3 (B) and FIG. 4 is a data string encoded by a first encoding mode. The first encoding mode is a mode involving the encoding of original data when the difference between one item of higher order data and another is in the range of ±1. When the first encoding mode has been selected, the differential data comprises a total of 2 bits: a count flag representing the difference, and a sign flag representing the sign of the difference. In this case, the differential data and the lower order data have to be represented together by 4 bits in the encoded data from the third byte onwards. Consequently, the lower order 2 bits of the 4 bits of lower order data in the original data string must be omitted, and the omitting error will appear as noise during decoding.

The second encoding mode is a mode involving the encoding of original data when the difference between one item of higher order data and another is +1 or −1. When the first encoding mode has been selected, there is no sign flag in the differential data because the sign of the differential data is either positive or negative. Consequently, the differential data is only 1 bit, namely the count flag representing the differential, and the lower order data of the original data can be represented with 3 bits. Therefore, there is only 1 bit of omitting error for the lower order data of the original data.

The third encoding mode is a mode involving the encoding of original data where the higher order data is identical. When the third encoding mode has been selected, the lower order data of the original data can be represented with 4 bits because there is no differential data. Consequently, there are 0 bits of omitting error for the lower order data of the original data, and an encoding process without encoding error can be achieved.

Moreover, the encoding error can be reduced in the first and second encoding modes by adding the average value of the omitted bits of the lower order data during decoding.

(Action of the first embodiment)

There now follows a description of the action of the data encoding device and the data decoding device according to the present embodiment.

Figure 6:
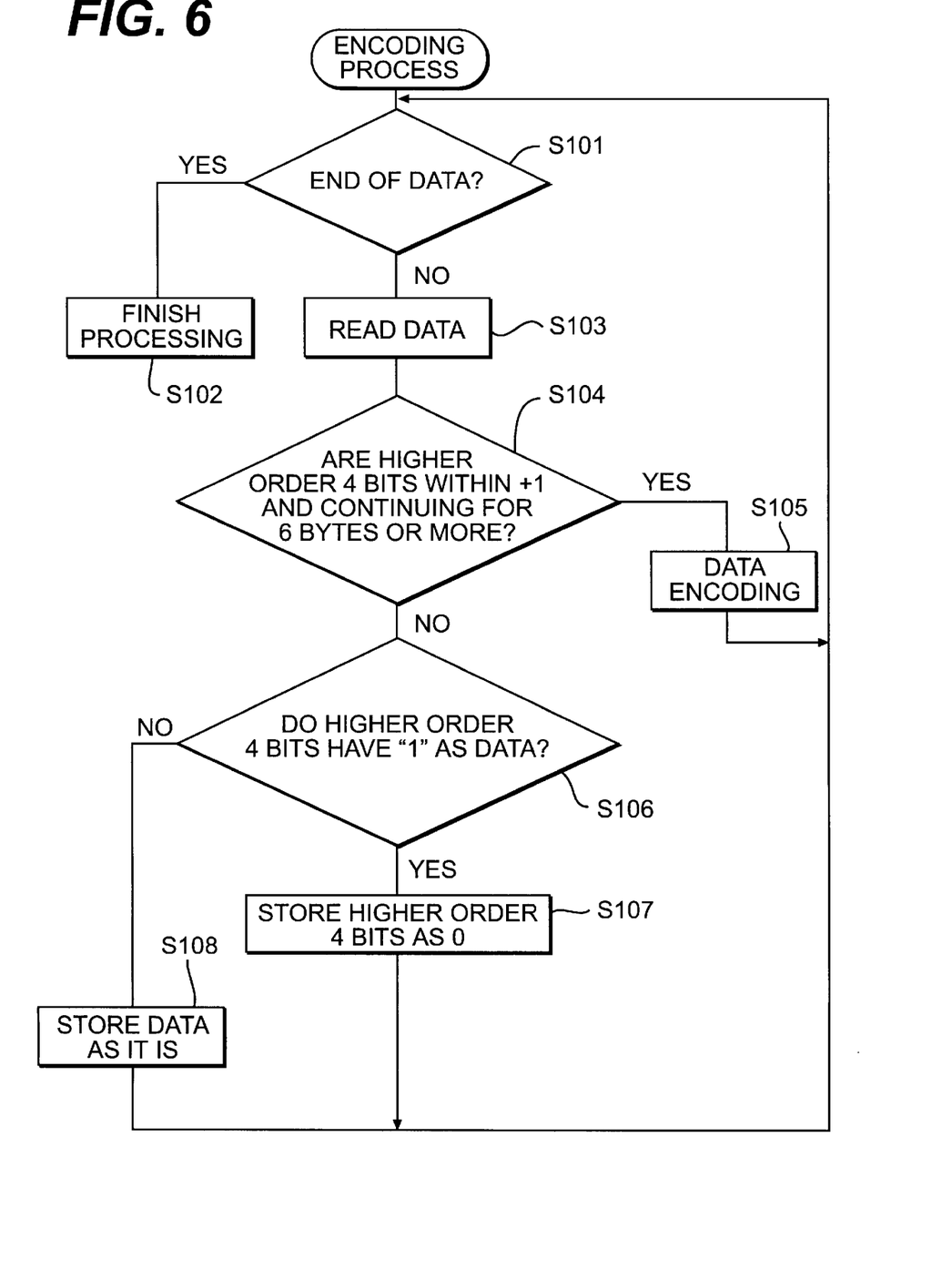
FIG. 6 is a flow chart representing a data encoding method according to the first embodiment of the present invention.

FIG. 6 is a main flow chart representing the action of the data encoding device. First, the data encoding device judges (S101) whether original data input has finished, and, if it has finished (YES in S101), it ends the encoding process (S102). On the other hand, if the original data input has not finished (NO in S101), the data encoding device 1 reads in the input original data in sequence (S103). Then the encoding decision means 1e judges (S104) whether higher order data with a difference of ±1 has continued for 6 bytes or more. For example, when higher order data with a difference of ±1 has continued for 6 bytes or more, as in the original data shown in FIG. 3 (A), the data encoding device 1 performs a process of data encoding (S105), and returns to the process of S101. Thus, the original data is encoded, and an encoded data string is output from the encoding device 1.

Figure 5:
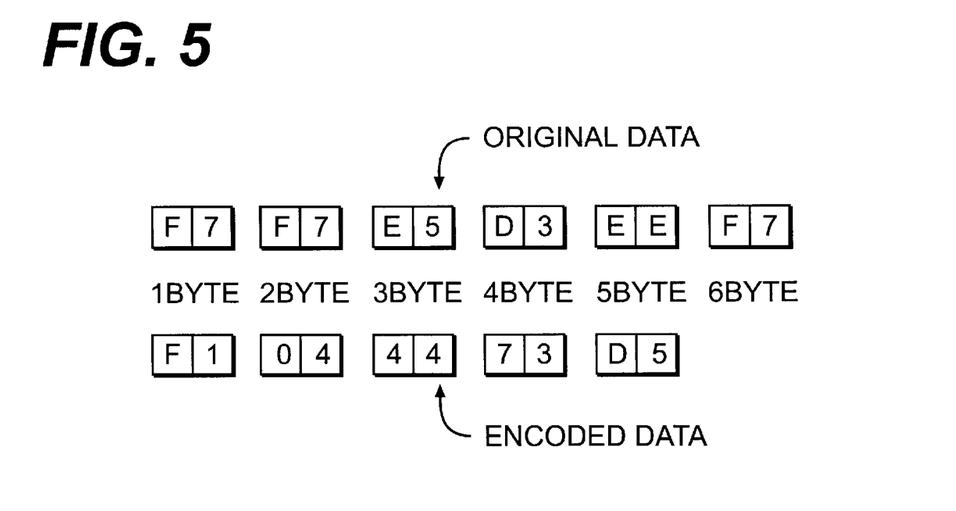
FIG. 5 is a diagram explaining the format of encoded data according to the first embodiment of the present invention.

It should be noted that, by making the judgement whether higher order data with a difference of ±1 continues for 6 bytes or more in the judgement of S104, the number of bytes of encoded data can be prevented from exceeding the number of bytes of original data. More specifically, when the original data string is 5 bytes or less, the number of bytes of the encoded data string is more than the number of bytes of the original data string, and one cannot expect a data compression effect. Thus, as shown in FIG. 5, in the present embodiment, the encoding process is only carried out when the original data string is 6 bytes or more.

When higher order data with a difference of ±1 does not continue for 6 bytes or more (NO in S104), the encoding decision means 1e judges whether the lower order data "1h" is present in the input original data (S106). When the "1h" lower order data is present (YES in S106), the encoding decision means 1e changes the "1h" lower order data to "0h" (S107). As discussed above, because the "1h" lower order data represents the initial byte of an encoded data string, when encoding is not carried out (NO in S104) it is necessary to prevent the decoding device 2 from erroneously carrying out the decoding process. Therefore, when encoding is not to be carried out, the "1h" lower order data is rewritten as "0h". When the "1h" lower order data is not present in the results of the judgement of S106, the encoding decision means 1e does not change the original data but outputs the original data without further modification. The encoding device 1 then repeats the process from S101 onwards. Using the above processing, an original data string representing audio or the like is encoded, and an encoded data string with little data volume is generated.

The data decoding process according to the present embodiment is now described.

Figure 7:
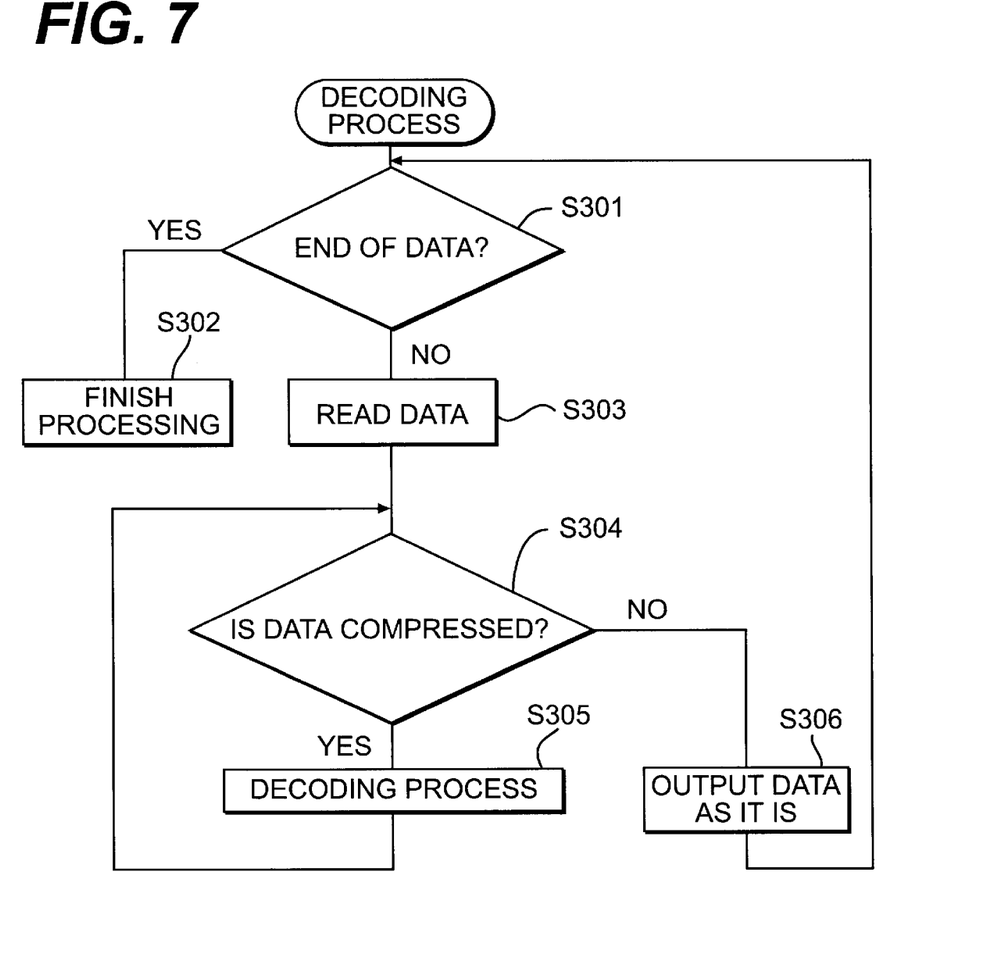
FIG. 7 is a flow chart representing a data decoding method according to the first embodiment of the present invention.

FIG. 7 is a flow chart representing the main routine in the data decoding process according to the present embodiment. In the figure, the data decoding device 2 judges whether the process of decoding the input encoded data has finished (S301). If the data decoding device 2 judges that the decoding process has finished (YES in S301), the data decoding device 2 ends all processing (S302). On the other hand, if the data decoding device 2 judges that the process of decoding the input encoded data has not finished (NO in S301), the data decoding device 2 carries out the process from S303 onwards.

In S303, the data decoding device 2 reads in the input data string, and the decoding decision means 2d judges whether the data string which has been read in is an encoded data string (S304). More specifically, the decoding decision means 2d judges whether the lower order data of the initial byte is "1h" which represents the start of an encoded data string. If the data decoding device 2 judges that the input data string is not an encoded data string (NO in S304), it outputs the input data string without further modification (S306), and returns to S301. On the other hand, if the data decoding device 2 judges that the input data string is an encoded data string (YES in S304), the encoded data splitting means 2a etceteras carry out the decoding of the encoded data string (S305). Thus, the input encoded data string is decoded in sequence (YES in S304) and is output from the data decoding device 2.

Figure 8:
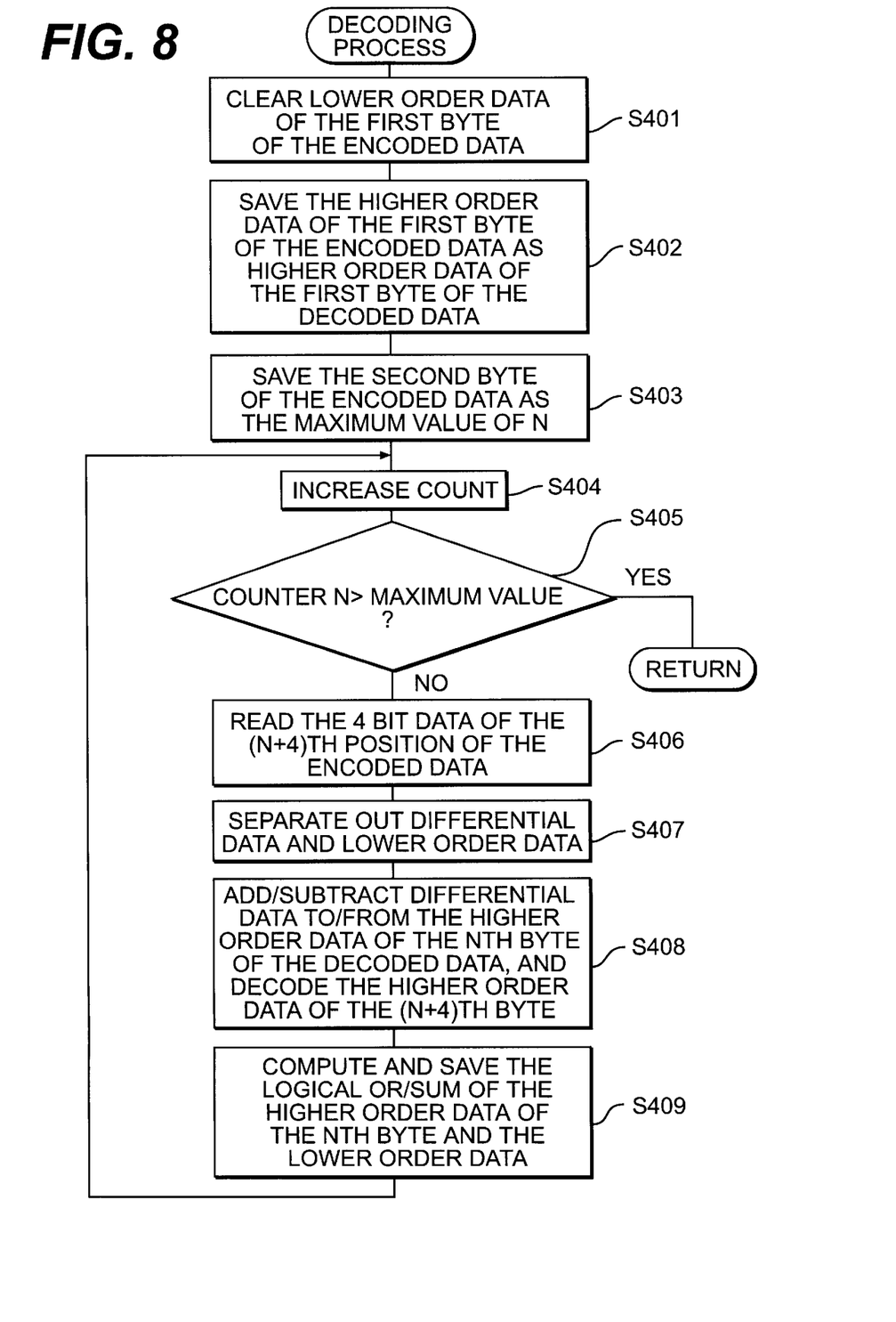
FIG. 8 is a flow chart representing details of a decoding process according to the first embodiment of the present invention.

FIG. 8 is a flow chart representing a subroutine in the decoding process of S305. In S401, first, the encoded data splitting means 2a clears the lower order data of the first byte of the encoded data string (S401), and this first byte data is saved as the higher order data of the decoded data of the first byte. For example, as shown in FIG. 3 (B), the encoded data splitting means 2a clears the lower order data "1h" of the first byte of the encoded data string and saves the higher order data "Fh" of the first byte.

Also, the encoded data splitting means 2a extracts the number-of-items data of the second byte of the encoded data string, and saves the value of this number-of-items data as the maximum value of the counter N in this subroutine (S403). Then, the encoded data splitting means 2a increments the value of the counter N (S404). It should be noted that the value of the counter N after the increment is "1" because the initial value of the counter N is "0". Also, the encoded data splitting means 2a judges whether the value of the counter N has exceeded the maximum value, which is to say whether the value of the counter N has exceeded the value of the number-of-items data (S405). As discussed above, the number-of-items data is at least "6" or more and the value of the counter at this time is "1". Consequently, the value of the counter N is less than the value of the number-of-items data (NO in S405) and the processing from S406 onwards is carried out.

In S406, the encoded data splitting means 2a reads the 4 bit data in the (N+4)th position in the encoded data. Because the value of N at this time is "1", the encoded data splitting means 2a reads the 4 bits of data in the 5th position in the encoded data, which is to say the higher order 4 bits of data of the third byte in the encoded data. For example, in FIG. 3 (B), the higher order 4 bits of data "4h" of the third byte in the encoded data string is read out.

Next, the encoded data splitting means 2a separates the differential data and lower order data out of the 4 bit data "4h" which has been read out (S407). In other words, from the 4 bit data which has been read out, the encoded data splitting means 2a extracts the higher order 2 bits as lower order data, and extracts the lower order 2 bits as differential data. When the 4 bit data "4h" (FIG. 3 (B)), which has been read out from the encoded data string, is expressed in binary, it is "0100". Consequently, the higher order 2 bits "01" of this data are extracted, and the lower order data "0100" ("4h" in hexadecimal notation) after decoding is obtained by shifting the "01" data which has been extracted 2 bits to the left. Further, the differential data "00" is determined by extracting the lower order 2 bits of the data "0100" which has been read out. Again, the encoded data splitting means 2a separates the differential data into a count flag "0" and a sign flag "0".

The differential decoding means 2b adds/subtracts the differential data to/from the higher order data in the decoded data of the Nth byte, and decodes the higher order data of the (N+1)th byte of the decoded data (S408). In other words, the differential decoding means 2b adds/subtracts the differential data to/from the higher order data "Fh" in the decoded data of the first byte, and thereby decodes the higher order data of the second byte of the decoded data. Because the differential data at this time is "00", the higher order data of the second byte of the decoded data is equal to the higher order data "Fh" of the first byte of the decoded data (FIG. 3 (C)).

Also, the decoded data combining means 2c combines (S409) the lower order data "4h" of the first byte in the decoded data with the higher order data "Fh" of the first byte (which has already been calculated in S402). In other words, the decoded data combining means 2c determines "F0h" by shifting the higher order data "Fh" 4 bits to the left, and calculates the logical OR of the "F0h" and the lower order data "4h". Thus, the first byte of decoded data (original data) "F4" is determined.

After this, the decoding device 2 returns to S404 and repeats the process from S404 to S409. In S404, the decoded data splitting means 2d puts the value of the counter N to "2" by incrementing the value of the counter N. Also, the encoded data splitting means 2a judges whether the value of the counter N has exceeded the maximum value (S405) and, if the result of the judgement is "NO", carries out the process from S406 onwards.

In S406, the encoded data splitting means 2a reads the 4 bit data in the (N+4)th position in the encoded data. In other words, the encoded data splitting means 2a delimits the encoded data string into 4 bits apiece and reads the 4 bit data in the (N+4)th position from the start of the encoded data string. Because the value of N at this time is "2", the encoded data splitting means 2a reads the 4 bits of data in the 6th position in the encoded data, which is to say the lower order 4 bits of data of the third byte in the encoded data. For example, in FIG. 3 (B), the lower order 4 bits of data "4h" of the third byte of the encoded data string are read out.

Next, the encoded data splitting means 2a separates (S407) the differential data and the lower order data out of the 4 bit data "4h" which has been read out. The values of the differential data and the lower order data so separated are respectively "00" (binary notation) and "4h". The differential decoding means 2b decodes (S408, FIG. 3 (C)) the higher order data "Fh" of the third byte of the decoded data by adding/subtracting the differential data to/from the higher order data "Fh" in the decoded data of the second byte. It should be noted that the higher order data "Fh" in the decoded data of the second byte is calculated by the process of S408 which was carried out previously. Then, the decoded data combining means 2c calculates (S409) the decoded data "F4" of the second byte by combining the lower order data "4h" of the second byte in the decoded data and the higher order data "Fh" of the second byte.

By repeating the above process, the encoded data shown in FIG. 3 (B) is decoded in sequence. Also, once all the encoded data has finished being decoded, the value of the counter N exceeds the maximum value (YES in S405) and, therefore, the processing in the data decoding device 2 returns to the main flow chart in FIG. 7.

Encoding and decoding encoding of audio data and the like can be carried out using the process described above. In general, there is relatively little variation in the higher order data because audio data, video data and the like often change relatively gradually. Consequently, audio data and the like can be encoded and decoded with a high compression ratio by carrying out differential encoding on only higher order data in the original data, and expressing the number of items of higher order data which has been subjected to the differential encoding as number-of-items data, as illustrated in the present embodiment. Further, the operations required for the data encoding and data decoding are processes such as differential operations and data sorting, and therefore encoding and decoding can be achieved with a high compression ratio using simple algorithms.

(A second embodiment)

A data encoding device and data decoding device according to a second embodiment of the present invention are now described. The configurations of the data encoding device and the data decoding device according to the present embodiment are largely the same as those in the first embodiment shown in FIG. 1 and FIG. 2. However, the encoding decision means 1e (FIG. 2) of the present embodiment differs from the first embodiment in that the encoding mode most suited to the original data string can be automatically selected.

Figure 9:
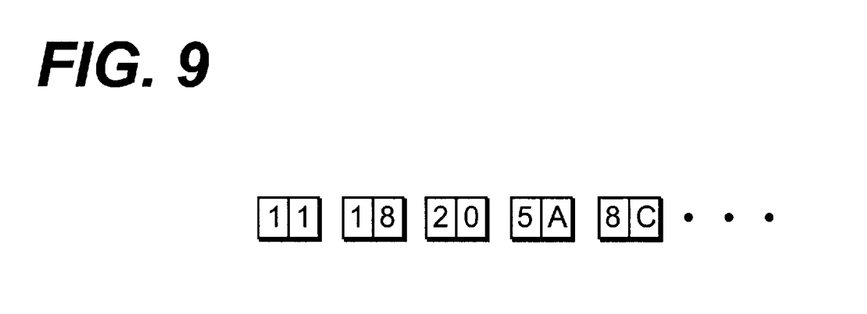
FIG. 9 is a diagram representing one example of an encoded data string according to a second embodiment of the present invention.
Figure 10:
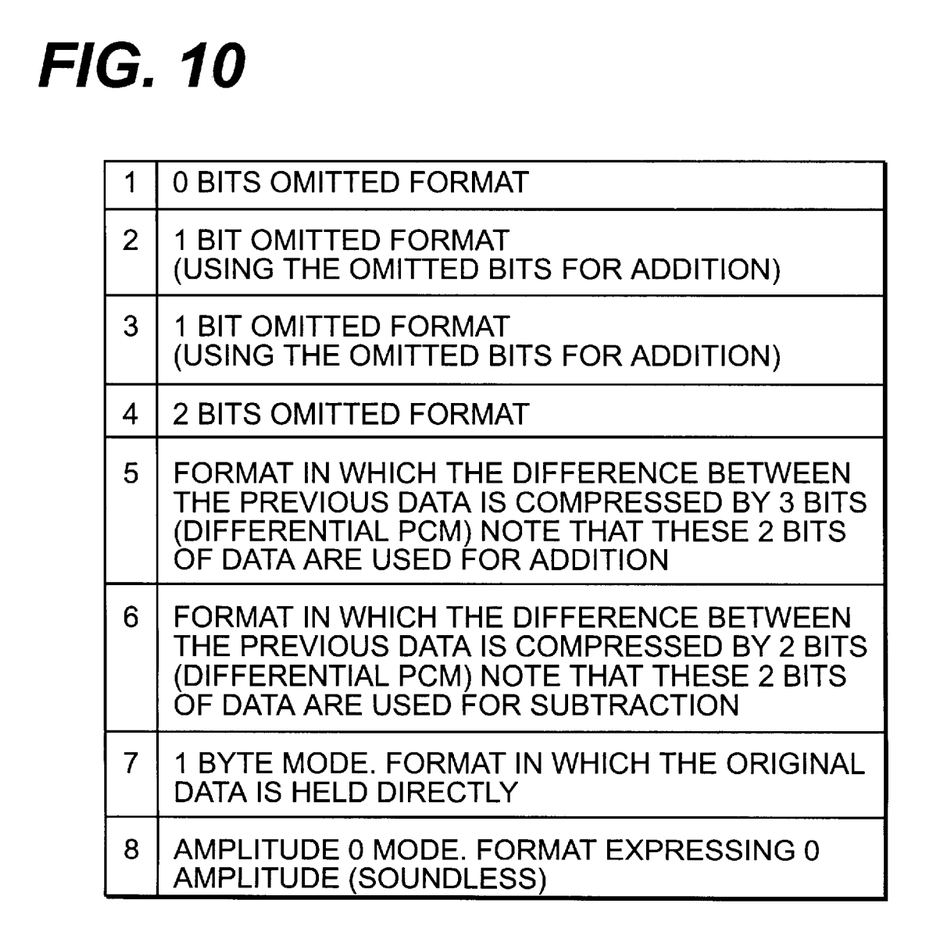
FIG. 10 is a diagram representing an encoding mode according to a second embodiment of the present invention.

The format of the encoded data string according to the present embodiment is shown in FIG. 9. In this figure, the data of the higher order 4 bits of the first byte represents the encoding mode. For example, the data "1h" of the higher order 4 bits of the first byte denotes that encoding has been carried out using the second encoding mode. It should be noted that there are 8 encoding modes in the present embodiment, a first to an eighth, as discussed hereinbelow. Further, the data of the lower order 4 bits of the first byte, and the data of the 8 bits of the second byte in the figure is number-of-items data representing the number of items of original data which has been encoded. Since the number-of-items data is represented by a total of 12 bits, an original data string up to a maximum of 4095 items can be encoded with the same encoding mode. The data from the third byte onwards represents the encoded data, and such data is encoded using a method which corresponds with the encoding mode.

Figure 11:
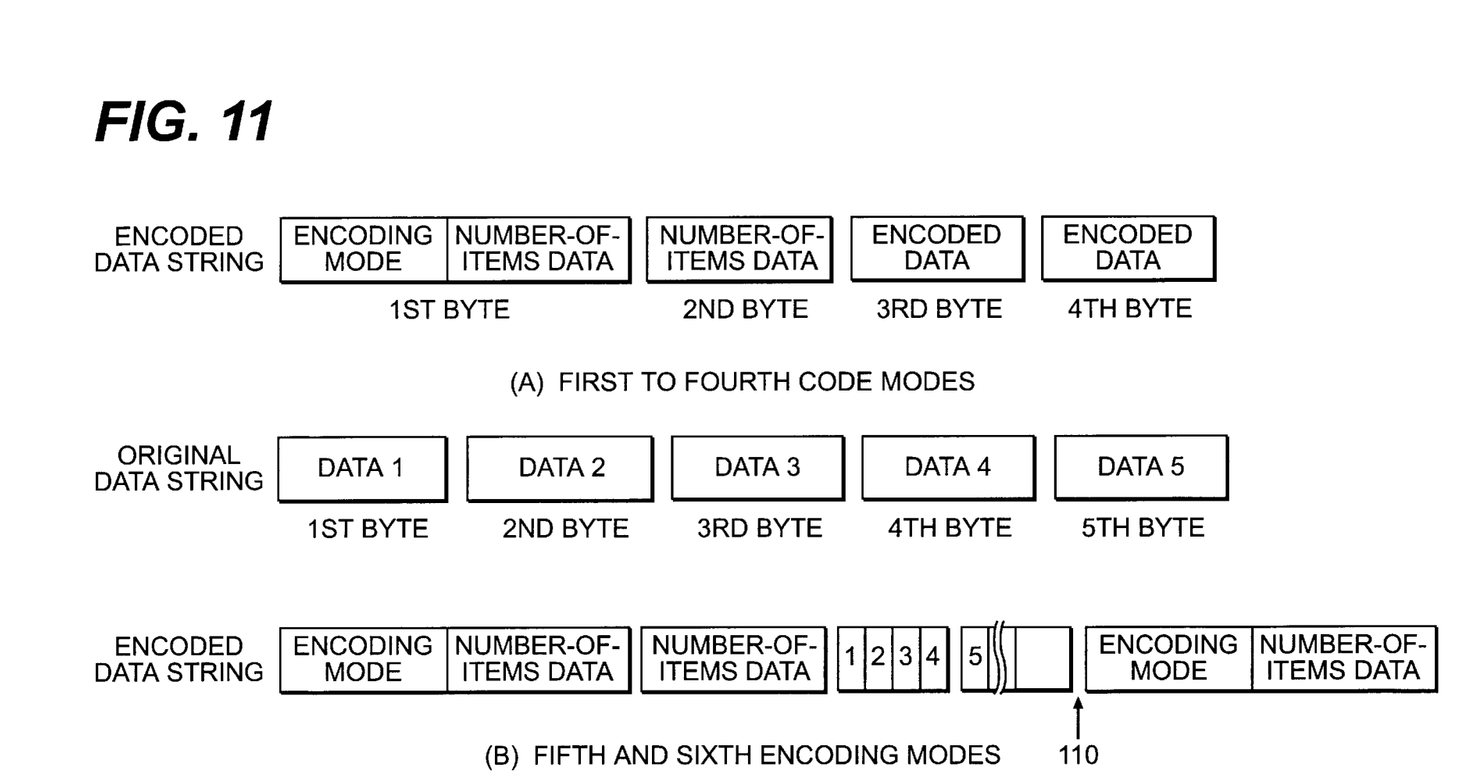
FIG. 11 is a diagram representing the encoding format of the first to fourth encoding modes, and the fifth and sixth encoding modes, according to the second embodiment of the present invention.

FIG. 11 shows an overview of encoding modes according to the present embodiment. These encoding modes are now described in turn.

The first encoding mode (the encoding mode (c)) corresponds to the third encoding mode in the first embodiment. In other words, this first encoding mode is a mode involving the encoding of original data having identical higher order data. When the first encoding mode has been selected, the lower order data of the original data can be represented with 4 bits because there is no differential data. Consequently, there are 0 bits of discarding error for the lower order data of the original data.

The second encoding mode (the encoding mode (c)) corresponds to the second encoding mode in the first embodiment. The second encoding mode is a mode involving the encoding of original data where the difference between one item of higher order data and another is +1. When the second encoding mode has been selected, there is no sign flag in the differential data because the sign of the differential data is only ever positive. Consequently, the differential data is only 1 bit, the count flag representing the differential, and the lower order data of the original data can be represented with 3 bits. Therefore, there is only 1 bit of discarding error for the lower order data of the original data.

The third encoding mode (the encoding mode (c)) corresponds to the second encoding mode in the first embodiment, and is a mode involving the encoding of original data where the difference between one item of higher order data and another is −1. The other encoding methods in the third encoding mode are the same as the second encoding mode.

The fourth encoding mode (the encoding mode (c)) corresponds to the first encoding mode in the first embodiment. This is to say, the fourth encoding mode is a mode involving the encoding of original data where difference between one item of higher order data and another is in the range of ±1. When the fourth encoding mode has been selected, the differential data comprises a total of 2 bits: a count flag representing the difference, and a sign flag representing the sign of the difference, and therefore the lower order data in the original data string has to be represented by 2 bits. Therefore, the lower order 2 bits in the 4 bits of lower order data will appear as discarding error in the form of noise during decoding.

Now, FIG. 11 (A) shows an encoded data string when the first to fourth encoding modes have been selected. The higher order 4 bits of data of the first byte in the encoded data string represents the encoding mode. For example, when this data is "3h", it will be possible to judge, during decoding, that the encoding was carried out in accordance with the fourth encoding mode. The number-of-items data, which represents the number of items of original data which have been encoded, is written in a total of 12 bits: the lower order 4 bits of data of the first byte, and the 8 bits of data of the second byte. Further, the lower order data of the original data is stored from the third byte onwards of the encoded data string together with the differential data. It should be noted that the first to fourth encoding modes in the present embodiment are different from the encoding modes in the first embodiment, and the higher order data of the first byte of the original data is not stored in the encoded data string. Consequently, when decoding a data string encoded using the first to fourth encoding modes, the higher order data in the encoded data string is decoded in sequence with reference to the higher order data of the decoded data which was decoded immediately before.

The fifth and sixth encoding modes (encoding mode (b)) are now described. These encoding modes are modes in which what is known as differential encoding (or differential coding) is carried out. When the difference between an item of original data and the next item of original data is confined within +2, and such original data continues for 4 bytes or more, the fifth encoding mode is adopted. Further, the sixth encoding mode is adopted when the difference between an item of original data and the next item of original data is confined within −2 and such original data continues for 4 bytes or more. The encoded data strings when the fifth and sixth encoding modes have been selected are shown in FIG. 11 (B). As shown in this figure, the encoded data from the third byte onwards represents differential data between neighbouring items of original data. It should be noted that the differential data for the first byte of original data is calculated based on the difference between the first byte of original data and the original data immediately preceding the first byte of original data.

The fifth and sixth encoding modes make it possible to compress 4 bytes' worth of original data into 1 byte of encoded data because the differential data is represented by 2 bits. However, data representing the encoding mode, and number-of-items data has to be provided in the encoded data string, and therefore, when less than 4 items of original data are encoded, the amount of data in the encoded data string increases beyond the amount of original data. Thus, encoding using the fifth and sixth encoding modes is only carried out when there are 4 or more continuous items of original data with differences within ±2.

Figure 12:
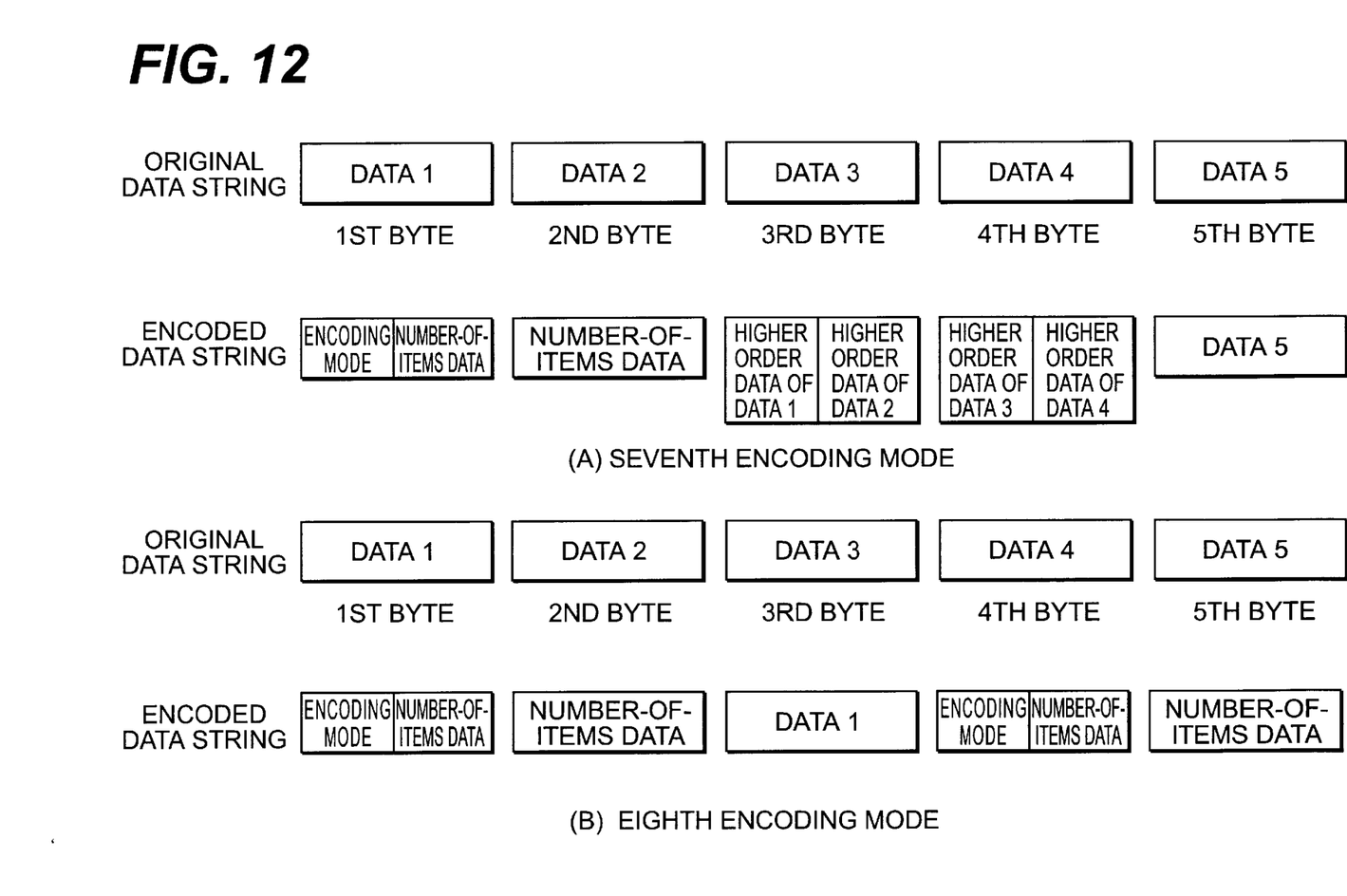
FIG. 12 is a diagram representing the encoding formats of the seventh encoding mode and eighth encoding mode according to the second embodiment of the present invention.

The seventh encoding mode (encoding mode (d)) is a mode in which the original data is stored in the encoded data string without further modification. However, because data representing the encoding mode, and number-of-items data is stored in the first and second bytes of the encoded data string, the amount of data would end up being increased by the encoding if all of the original data were to be stored in the encoded data string. Thus, as shown in FIG. 12 (A), such an increase in the amount of data is avoided by storing only the higher order data of the first to fourth bytes of the original data in the encoded data string. Original data from the fifth byte onwards is stored, without further modification, from the fifth byte onwards in the encoded data string. Consequently, using the seventh encoding mode, the ratio of the amount of encoded data to the amount of original data (the compression ratio) is 100%.

The eighth encoding mode (encoding mode (a)) is a mode involving the encoding of original data where the difference with respect to a reference set of original data (data 1) is ±d. FIG. 12 (B) shows a data string encoded when the eighth encoding mode has been selected. In this figure, the original data of the first byte is stored in the third byte of the encoded data. In addition, data representing the number of items of original data which are continuous and where the difference from the original data of the first byte is ±d is stored in the second byte and the lower order data of the first byte in the encoded data string. Further, a single encoded data string comprises 3 bytes of encoded data. Therefore, the eighth encoding mode is selected when there are 3 or more continuous items of original data within the range of ±d.

This eighth encoding mode makes it possible to encode and decode portions, where there is little variation in the original data, with a high compression ratio. For example, when items of original data (audio data) with a weak signal continue, the play-back sound of such items of original data can be perceived as having no sound as far as the listener is concerned. Consequently, in such cases, it is possible to achieve encoding and decoding with extremely high compression by storing the number of items of original data within the predetermined range (within the range d) in the encoded data string. It should be noted that the value of d can be freely set by the user or whoever. For example, when the original data is audio data, it is desirable to set d to a value close to no-sound (for example, d<8).

Figure 13:
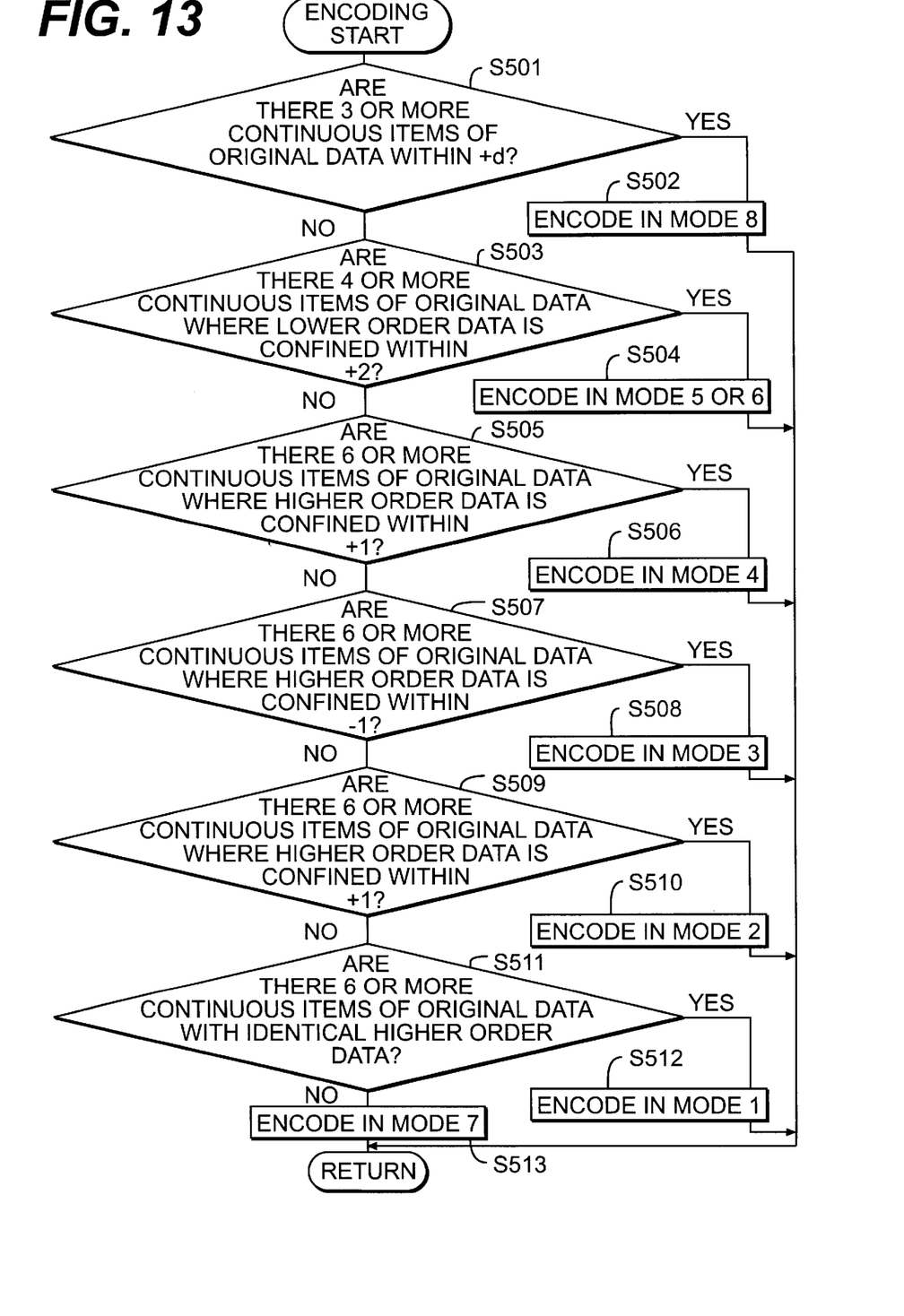
FIG. 13 is a flow chart representing a data encoding method according to the second embodiment of the present invention.

The action of the present embodiment is now described with reference to the flow chart shown in FIG. 13. This flow chart is the main flow chart representing the encoding process. The data encoding device 1 (FIG. 2) according to the present embodiment automatically selects one of the eight different encoding modes discussed above to match the original data, and encodes the original data based on the encoding mode selected. As shown in FIG. 13, the judgement about whether to select an encoding mode is carried out sequentially from the encoding mode with the highest compression ratio.

First, the encoding decision means 1e judges (S501) whether the difference with the original data acting as the reference (the data 1 in FIG. 12 (B)) is within the range ±d and such original data is continuing for a continuous 3 bytes or more. If the result of this judgement is YES, the encoding decision means 1a selects the eighth encoding mode. Then the original data splitting means 1a, the differential detection means 1b, the number-of-items data calculation means 1c, and the encoded data combining means id encode the original data in accordance with the eighth encoding mode (S502). For example, portions corresponding to a no-sound state in the original data are encoded using this eighth encoding mode (FIG. 12 (B)).

Meanwhile, if the result of the judgement of S501 is NO, the encoding decision means 1e makes the judgement of S503. In S503, the encoding decision means 1e judges whether data in which lower order data is confined within ±2 continues for 4 items or more. If the result of the judgement is YES, the encoding decision means 1e selects the fifth or sixth encoding mode, and the original data splitting means 1a etceteras encode the original data in accordance with the fifth or sixth encoding mode (S504). Thus, the original data is encoded by what is known as differential PCM (FIG. 11 (B)).

If the result of the judgement of S503 is NO, the encoding decision means 1e makes the judgement of S505. In other words, the encoding decision means 1e judges (S505) whether data in which the higher order data is confined within ±1 continues for 6 items or more. Then, if the result of the judgement is YES, the encoding decision means 1e selects the fourth encoding mode. The original data splitting means 1a etceteras encode in accordance with the fourth encoding mode (S506). In other words, the differential calculation means 1b expresses the differential data between the higher order data of items of original data in 2 bits, and discards two bits of the lower order data of the original data. Also, the encoded data combining means 1d stores the lower order data and the differential data from the third byte onwards in the encoded data string (FIG. 11 (A)).

If the result of the judgement of S505 is NO, the encoding decision means 1e makes the judgement of S507. In S507, the encoding decision means 1e judges whether original data in which higher order data is confined within −1 continues for 6 items or more. If the result of this judgement is YES, the encoding decision means 1e selects the third encoding mode. The original data splitting means 1a and the like decode the original data in accordance with the third encoding mode (S508). In other words, the differential calculation means 1b expresses the differential data between the higher order data of items of original data in 1 bit, and discards the lowest 1 bit of the lower order data of the original data. Also, the encoded data combining means 1d stores the lower order data and differential data from the third yte onwards in the encoded data string (FIG. 11 (A)).

If the result of the judgement of S507 is NO, the encoding decision means 1e makes the judgement of S509. In S509, the encoding decision means 1e judges whether original data in which the higher order data is confined within +1 continues for 6 items of more. If the result of the judgement is YES, the encoding decision means 1e selects the second encoding mode, and the original data splitting means 1a etceteras encode the original data in accordance with the second encoding mode (S510). The second encoding mode is an encoding mode in which differential data relating to the third encoding mode discussed above is represented with a positive sign (FIG. 11 (A)).

If the result of the judgement of S509 is NO, the encoding decision means 1e makes the judgement of S511. In S511, the encoding decision means 1e judges whether identical items of higher order data continue for 6 items or more. Also, if the result of the judgement is YES, the encoding decision means 1e decodes the original data in accordance with the first encoding mode (S512, FIG. 11 (A)). Because, in the first encoding mode, there is no differential data representing the difference between one item of higher order data and another, the lower order data of the original data is stored in the encoded data string without further modification. Consequently, there are 0 bits of lower order data discarding error and it is possible to avoid such things as noise during decoding. Finally, if the result of the judgement of S511 is NO, the encoding decision means 1e selects the seventh encoding mode. The original data splitting means 1a and the like store the original data in the encoded data string (FIG. 12 (A)) in accordance with the encoding format shown in FIG. 12 (A). Using this seventh encoding mode, the original data is stored in the encoded data string without further modification, except for the first to the fourth items of original data. Consequently, when the seventh encoding mode has been selected, there is no data compression effect.

Using the above process, the encoding of one portion of the original data string is finished. Also, after the processing by the data encoding device 1 has returned to the main flow chart which is not depicted, this flow chart is run again. In this way encoding is carried out using the encoding mode which is most suited to each portion of the original data string. The data decoding device 2 successively detects data representing the encoding mode from the encoded data string, and carries out a decoding process matched to the encoding mode. Consequently, the present embodiment makes it possible to achieve high-compression encoding and decoding while keeping sound-quality and picture-quality deterioration to a minimum. Thus, in TV games machines and the like, it is possible to store a relatively large amount of audio data, video data and the like in a ROM cassette or the like where data capacity is limited.

It should be noted that the present invention is not limited to the above embodiments and can be implemented in a range from which its essence is not departed. For example, the above embodiments may also be applied to original data of 16 bits, 32 bits and the like, and not simply to 8 bit original data. Further, the higher order data and lower order data of the original data need not necessarily be split into 4 bits apiece. For example, it is possible to allocate 2 bits to higher order data and 6 bits to lower order data.

INDUSTRIAL APPLICABILITY

As described above, the present invention makes it possible to reduce the amount of differential data, compared to common PCM, by carrying out the encoding process using the differential data of only the higher order data, of the original data, where there is relatively little variation. In other words, there is generally relatively little change in the higher order data of the audio data and video data used in multimedia including TV games machines. Therefore, the amount of differential data of the higher order data can be reduced, and high-compression encoding and decoding can be achieved. Also, because in the present invention the differential of higher order data, where there is relatively little variation, is calculated, it follows that the differential data does not exceed a predetermined data length and, therefore, encoding and decoding error can be reduced.

Further, because it is sufficient to calculate the differential of only the higher order data, the encoding and decoding algorithms can be simplified. Consequently, it is possible to reduce the device production costs of domestic TV games machines and the like. Also because the encoding and decoding can be achieved using simple algorithms, the encoding and decoding can be carried out at high speed.

I claim:

1. A data encoding device comprising:
    an input means which inputs original data strings in which original data comprising a plurality of bits has been arranged into a plurality of sequences;
    original data splitting means for splitting original data into higher order data including the highest order bit and lower order data including the lowest order bit;
    differential calculation means for calculating differential data between respective items of the higher order data in neighbouring items of original data; and
    output means for outputting an encoded data string including said lower order data and said differential data.

2. A data encoding device comprising:
    an input means which inputs original data strings in which original data comprising a plurality of bits has been arranged into a plurality of sequences;
    original data splitting means for splitting original data into higher order data including the highest order bit and lower order data including the lowest order bit;
    differential calculation means for calculating differential data between respective items of the higher order data in neighbouring items of original data;
    data number calculation means for locating groupings of the differential data in which the differential data is continuously confined within a predetermined range, and outputting number-of-items data reflecting the number of items within the sequences; and
    output means for outputting an encoded data string including said number-of-items data, said differential data, and said lower order data.

3. A data encoding device as claimed in claim 2, further comprising an encoded data combining means for omitting the lower order bits in said lower order data which correspond to the number of bits of said differential data and combining said differential data with the omitted lower order data.

4. A data encoding device as claimed in claim 2, in which said predetermined range is "0" and the number of bits of the differential data is "0".

5. A data encoding device as claimed in claim 2, comprising further an encoding decision means which outputs an encoded data string from said output means when the number of items of the encoded data constituting the encoded data string is less than the number of items of the original data constituting the original data string.

6. A data decoding device comprising:
    input means for inputting an encoded data string;

encoded data splitting means for extracting differential data and lower order data by splitting the encoded data string;

differential decoding means for generating higher order data based on the differential data;

decoded data combining means for generating decoded data corresponding to a non-encoded version of the data string by combining the higher order data and lower order data; and output means for outputting the decoded data string in which a plurality of items of decoded data have been sequenced.

7. A data decoding device comprising:

an input means for inputting an encoded data string;

an encoded data splitting means for extracting differential data, lower order data, and number-of-items data by splitting the encoded data string;

differential decoding means for generating higher order data based on the differential data;

decoded data combining means for generating decoded data corresponding to a non-encoded version of the data string by combining higher order data and lower order data based on the number-of-items data; and output means for outputting the decoded data string in which a plurality of items of decoded data have been sequenced.

8. A data encoding method in which original data making up an original data string is split into higher order data and lower order data, the method comprising the steps of:

calculating differential data between respective items of higher order data in neighbouring items of original data;

locating sequences of the differential data in which the differential data is continuously confined within a predetermined range, and outputting number-of-items data reflecting the number of original data items in the sequences; and generating an encoded data string in which said number-of-items data, said differential data, and said lower order data have been sequenced.

9. A data encoding method as claimed in claim 8, in which the lower order bits in said lower order data which correspond to the number of bits of said differential data are omitted, and said differential data is combined with the omitted lower order data.

10. A data decoding method in accordance with either claim 8 or claim 9, further comprising the steps of:

generating higher order data based on the differential data;

generating decoded data by combining the higher order data and the lower order data; and outputting a decoded data string in which the plurality of generated items of decoded data are sequenced.

11. A data encoding method in which an encoded data string is generated by encoding an original data string, the original data string comprising a plurality of bits arranged into a plurality of sequences in accordance with the following encoding modes (a) to (d):

(a) when original data, whose difference from a reference item of original data is confined within a predetermined range, is sequenced continuously for more than a predetermined number of items, generating an encoded data string in which said reference item of original data is sequenced together with number-of-items data representing the number of said continuous items of original data;

(b) when the encoding process of encoding mode (a) is not carried out, and when differential data between one item of neighbouring original data and a second item of neighbouring original data is confined within a predetermined range and the original data is sequenced continuously for more than a predetermined number of items, generating an encoded data string in which said differential data is sequenced together with number-of-items data representing said number of items of original data;

(c) when the encoding processes of encoding modes (a) and (b) are not carried out, and when the differential data representing the difference between items of higher order data in neighbouring items of original data is confined within a predetermined range and the original data is sequenced continuously for more than a predetermined number of items, generating an encoded data string in which number-of-items data representing said number of items of original data is sequenced together with lower order data of said original data and said differential data; and (d) when the encoding processes of encoding modes (a), (b), and (c) are not carried out, generating an encoded data string in which the original data is sequenced.

12. A data encoding method as claimed in claim 11, in which data denoting one of the encoding modes (a) to (d) with which the encoding process has been carried out is sequenced in said encoded data string.

13. A data decoding method in which data of a predetermined encoding mode is extracted from an encoded data string, the method comprising the steps of:

(1) when the extracted data corresponds to a first encoding mode, extracting a reference item of original data and number-of-items data which represents the number of items of original data from the encoded data string, and outputting a decoded data string in which the number of items of reference data denoted by the number-of-items data is sequenced;

(2) when the extracted data corresponds to a second encoding mode, extracting the differential data and the number-of-items data which represents the number of items of original data from the encoded data string, generating decoded data based on the differential data, and outputting a decoded data string in which the number of items of decoded data denoted by the number-of-items data is sequenced;

(3) when the extracted data corresponds to a third encoding mode, extracting the differential data, lower order data, and number-of-items data which represents the number of items of original data from the encoded data string, generating higher order data by combining the higher order data and the lower order data, and outputting a decoded data string in which the number of items of decoded data denoted by the number-of-items data is sequenced; and (4) when the extracted data corresponds to a fourth encoding mode, extracting the original data from the encoded data string, and outputting a decoded data string in which the extracted original data is sequenced.

* * * * *